United States Patent [19]

Mehta et al.

[11] Patent Number: 4,816,081
[45] Date of Patent: Mar. 28, 1989

[54] APPARATUS AND PROCESS FOR STATIC DRYING OF SUBSTRATES

[75] Inventors: Jitesh R. Mehta, Eagan; Don C. Burkman, Excelsior, both of Minn.; Cooky Mezaki, Tokyo, Japan

[73] Assignee: FSI Corporation, Chaska, Minn.

[21] Appl. No.: 15,247

[22] Filed: Feb. 17, 1987

[51] Int. Cl.$^4$ .............................................. B08B 30/00
[52] U.S. Cl. ......................................... 134/30; 34/15; 34/92; 134/32; 134/134; 134/147; 134/165
[58] Field of Search ............. 34/15, 92; 134/21, 25.4, 134/25.1, 32, 30, 134, 142, 165, 184, 61, 62, 66, 77, 79, 83, 86, 89, 135, 140, 153, 155, 159, 186, 137, 157

[56] References Cited

U.S. PATENT DOCUMENTS

| | | | |
|---|---|---|---|
| 4,132,567 | 1/1979 | Blackwood | 134/21 |
| 4,589,926 | 5/1986 | Holmstand | 134/32 |
| 4,643,774 | 2/1987 | Kishida et al. | 134/32 |

*Primary Examiner*—H. M. S. Sneed
*Assistant Examiner*—Sharon T. Cohen
*Attorney, Agent, or Firm*—Faegre & Benson

[57] ABSTRACT

A process for drying semiconductor wafers or similar substrates maintains the substrates in a static position to avoid the generation of undesired particulate. The substrates are maintained within the apparatus at an angle of approximately 30° from the vertical to facilitate complete drainage of the processing fluid. According to this invention, the substrates are positioned in the chamber of the apparatus at the appropriate angle, the chamber is closed in a fluid tight seal and filled with the processing fluid, until the fluid overflows through a vacuum valve. While maintaining the chamber completely filled, vacuum aspiration is continued to degas the chamber. While continuing vacuum aspiration of the chamber, a vacuum assisted drain valve is opened, and clean dry inert gas is introduced above the draining fluid. The draining step assures that any droplets remain with the draining fluid so that the substrates emerge dry as the fluid drains away. The inert gas flow is discontinued and vacuum aspiration is maintained briefly after the chamber has drained. The vacuum aspiration is discontinued and the chamber is repressurized to essentially ambient pressure prior to opening the chamber to remove the dry substrates.

23 Claims, 1 Drawing Sheet

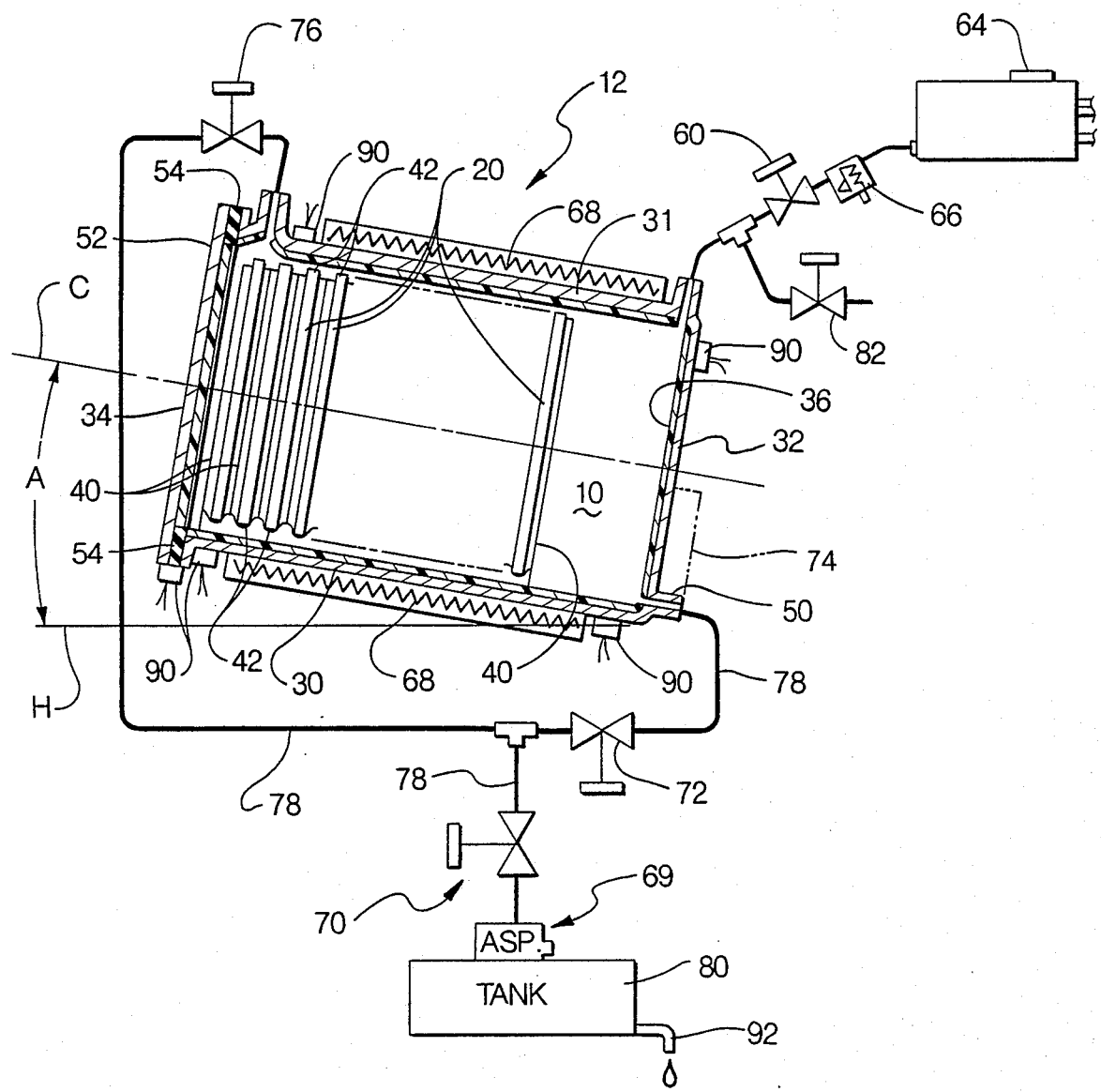

APPARATUS AND PROCESS FOR STATIC DRYING OF SUBSTRATES

BACKGROUND OF THE INVENTION

1. Field of the Invention

This invention relates to a process for drying semiconductor wafers or similar substrates and in particular relates to a process which maintains the substrates or wafers in a motionless or static situation during the drying procedure. This invention also relates to an apparatus for drying wafers or substrates, which maintains the wafers or substrates in a motionless or static situation during the drying process. Maintaining the wafers or substrates in a static situation during the drying procedure avoids the undesirable generation of particulate which is deleterious to the wafers or substrates.

2. Description of the Prior Art

At present, the majority of the processes available for wafer and substrate drying are based on a spin drying technique. The equipment used is commonly referred to as a spin rinser dryer (SRD). In SRD equipment, the wafers are contained in a carrier which is positioned either at the center or at the periphery of a basket, and the basket is rotated or spun about its axis at high speed. The centrifugal forces generated by high speed rotation strips the droplets of water from the surface of the wafer. During the high speed spin operation, nitrogen or other inert gas may be introduced to generate turbulence in the basket holding chamber assisting the complete removal of droplets from the wafer surface. Heating of the chamber and its contents above ambient temperatures may be used to enhance the drying operation. For example, heat may be introduced in the form of a flow of heated nitrogen or other suitable inert gas or the chamber itself may be equipped with heating elements.

In the SRD process, the high speed spinning of the basket has been found to be a source of generation of particulate which can deposit on and contaminate the wafers or substrates. Generally, the basket and the speed of rotation are designed to minimize relative movement of the wafers in relation to their position within the basket, but some movement of the wafer within the carrier is always possible. Any movement of the wafer substrate with respect to its position within the carrier is likely to generate deleterious particulate. In addition, the turbulence engendered by the introduction of inert gas into the system is further likely to be a source of particulate.

Another type of equipment used for drying of wafers and substrates, referred to as an IPA dryer, involves immersing the wafers in a liquid/gaseous bath of IPA (isopropyl alcohol). The IPA dryer is based on the principle that, since water is miscible with alcohol, the alcohol will mix with and carry away the water present on the surface of the wafer, eventually leaving only a film of alcohol on the wafer. Since the alcohol has a high vapor pressure, it quickly evaporates leaving the surface of the wafer dry. A negative aspect of the IPA drying process is that the alcohol may leave organic residue remaining on the surface of the wafer as it evaporates. Considering the high level of cleanliness required for the surface of the wafers, this is an unacceptable drawback to the IPA drying technique.

In co-pending commonly assigned U.S. patent application No. 06/832,506, filed Feb. 21, 1986, now U.S. Pat. No. 4,736,760, patented Apr. 12, 1988, there is disclosed a method and apparatus for cleaning substrates with megasonic energy and then for separately rinsing and drying the substrates. The rinsing and drying procedure involves immersing the substrates in a rinse solution at ambient or elevated temperature, and then lifting the substrates from the solution at a slow controlled rate of removal. Although this procedure has certain advantageous features over the SRD and IPA processes, there is still need for improvement in providing both equipment and method for rinsing and drying substrates in a static or motionless process, presenting them clean, dry and free of unwanted particulate.

In U.S. Pat. No. 4,577,650, issued Mar. 25, 1986, there is disclosed an apparatus for treating wafers and substrates which comprises a plurality of vessel segments serially nested together and engaged with a fluid inlet and a fluid outlet connected in a wafer treatment fluid flow line. This process has not so far met with commercial acceptance or success, and there is still need for improvement in the drying of such substrates.

SUMMARY OF THE INVENTION

This invention provides a process for drying wafers or substrates which allows the wafers or substrates to remain in an essentially motionless or static condition throughout the entire procedure. This invention also provides an apparatus for carrying out the process of drying wafers or substrates in an essentially motionless or static condition throughout the entire procedure. Maintaining the wafers or substrates in a static condition throughout the drying process prevents the undesirable generation of particulate.

The apparatus used in carrying out the process of this invention comprises a chamber for enclosing the wafers, provided with a means for opening the chamber to permit insertion and removal of the wafers and means for closing the chamber to maintain the chamber in a fluid-tight seal. The chamber is equipped with valves for controlling the introduction and draining or evacuation of process fluids.

Inside the chamber, the wafers are maintained in standard wafer carriers, which support the wafers primarily by their edges in spaced apart relationship generally parallel to each other. The wafers are further supported within the chamber so that the planar surfaces of the wafers are inclined from the vertical at an angle up to about 30°, preferably at an angle of about 5°–15° to the vertical. The wafers may suitably be maintained at the desired angle of inclination by inclining the chamber itself or the wafer carriers. The angled alignment of the chamber and the wafers facilitates the complete drainage of water from the surface of the wafers during the draining cycle.

The operation of the process comprises the following steps:

1. The wafers are loaded into the chamber, for example, in standard carriers in which they are supported primarily by their edges in spaced apart alignment generally parallel to each other. The carrier or carriers are positioned within the chamber such that the planar surface of the wafers are inclined from the vertical at an angle of up to about 30°, preferably at an angle of between 5° to 15° with the vertical. The chamber is closed in a fluid tight seal. The chamber may desirably be heated to a temperature of 50°–100° C. or slightly above throughout the process.

2. The chamber is completely filled with hot (approximately 50°–100° C.) conventional rinsing solutions, such as halocarbons, alcohols, polyhydric alcohols, or preferably deionized water, while maintaining vacuum aspiration of the interior of the chamber. D.I. water is introduced at a slow enough rate so as not to disturb the position of the wafers and is continued until the water overflows through the vacuum valve to assure complete filling of the chamber.

3. While maintaining the chamber completely filled with D.I. water, vacuum aspiration is continued for a few minutes to reduce the pressure in the chamber to between about 300 to 400 mm Hg. Since a small amount of water may be aspirated from the chamber during the vacuum aspiration procedure, additional hot D.I. water is introduced as necessary to maintain the chamber completely filled during the vacuum aspiration procedure.

4. While continuing vacuum aspiration of the chamber, the drain valve is opened allowing the water to drain from the chamber, while clean dry inert gas is introduced above the water. The drain valve may also preferably be vacuum assisted. Continued vacuum aspiration during and after completion of draining further serves to insure complete removal of water vapor from the interior of the chamber.

5. After the chamber interior has drained completely, the flow of inert gas is discontinued and vacuum aspiration is continued for a few minutes until the pressure in the chamber has been reduced to sub-atmospheric, approximately 650 mm Hg.

6. The chamber is then repressurized by introducing clean dry inert gas to a pressure at or slightly above normal atmospheric pressure, the fluid tight seal is released and the chamber is opened to remove the dry wafers.

The chamber used in the process according to this invention is of a suitable configuration that maintains the wafers throughout the process in the manner described and that provides a plurality of valves for controlling the introduction and drainage or evacuation of processing fluids as described.

Prior to drying the wafers according to the drying process of this invention, it may be desired to rinse the wafers in the chamber once or several times with hot or cold water or other conventional rinsing solutions as previously mentioned. Prior to rinsing the wafers, it may be desired to clean the wafers in teh chamber with hor or cold conventional cleaning solutions generally according to the sequence described hereinabove for the drying procedure.

BRIEF DESCRIPTION OF THE DRAWINGS

FIG. 1 is a functional schematic side elevation diagram.

DETAILED DESCRIPTION OF THE PREFERRED EMBODIMENT

The chamber 10 of the static dryer 12 used in carrying out the process of this invention encloses the wafers 20, maintaining them in a motionless or static position. The wafers 20 are preferably placed in the chamber 10 in standard carriers 40, wherein they are held in a spaced apart relationship generally parallel to each other supported primarily by their edges 42 so that the planar surfaces of the wafers are included at an angle from their vertical of up to 30°, preferably 5°-15°. The wafers are supported in a spaced apart relationship primarily by their edges 42 so that the planar surfaces of the wafers are exposed to the operation of the rinsing and drying procedures. Maintaining the wafers at an angle included from the vertical is designed to insure complete and efficient drainage of water from the surfaces of the wafers. Suitably, the chamber 10 may have lateral walls 30, 31 which may be rectangular or cylindrical, with a closed end 32 and an openable end 34 for insertion and removal of the wafers 20. The wafers may be maintained at the desired angle of inclination by suitably inclining the chamber 10. The angle of inclination A of the chamber 10 can be such that the normally horizontal axis C of the chamber forms an angle A with the horizontal H of between 0° to 89°, preferably between 5° to 15° from the horizontal, with the openable end 34 maintained relatively higher than the closed end 32.

The chamber 10 is further provided with a plurality of valves to allow introduction and drainage or evacuation of processing fluids, and is openable for insertion and removal of the wafers and closeable to maintain the chamber in a fluid tight seal. Desirably, the chamber is equipped with means for heating the chamber and its contents throughout the drying process, preferably to a temperature of 50°–100° C. or slightly higher, to prevent the development of a temperature differential between the processing fluids and the chamber and enclosed wafers. The interior of the chamber has a preferably hydrophobic finish 36 to efficiently facilitate the drainage of water. A chamber formed of or interiorly lined with a fluoropolymer material such as Teflon is preferred.

The wafers 20 may be contained inside the chamber 10 in standard wafer carriers 40 which may be of any standard material, such as a fluoropolymer or quartz.

A drain 50 is provided in the chamber 10 to allow controlled drainage of water from the chamber. To facilitate the complete drainage of the chamber, the drainage means is located in the lowest portion of the chamber. It is an important feature of the operation of the apparatus of the present invention that the drainage means be designed to control drainage of the water from the chamber during the drying cycle at a slow predetermined rate so that the surface tension of the water allows the water droplets to remain with the bulk of the draining water, rather than adhering to the surface of the wafers or the chamber.

The openable end 34 of the chamber 10 can be a door 52 which allows access to the interior of the chamber 10 for inserting and removing wafers 20. When closed, the chamber is maintained in a fluid tight seal. Preferably, pneumatic pressure is supplied by a plurality of pneumatic cylinders with a sealing gasket 54 interposed between the mating edges of the door 52 of the openable end 34 and the lateral walls 30, 31 of the chamber 10.

To begin the process, the chamber 10 is loaded with wafers 20 and closed in a fluid tight seal. If it is desired to rinse the wafers prior to the drying process, hot or cold deionized water is introduced into the chamber through the appropriate fluid inlet valve 60. After completion of the optional rinsing cycle, the drain 50 is opened to allow the chamber 10 to empty completely. If desired, several rinsing cycles may be used prior to beginning the drying process of this invention. If it is desired to clean the wafers prior to he rinsing process and the drying process of this invention, hot or cold conventional cleaning solution is introduced into the chamber from an appropriate reservoir 64 through the appropriate fluid inlet valve 60. The optional cleaning cycle then proceeds generally according to the sequence described hereinabove for the drying procedure. After completion of the optional cleaning cycle, the drain 50 is opened to allow the chamber to empty completely before proceeding with a subsequent rinsing cycle and then the drying procedure according to this invention.

To begin the drying cycle according to this invention, the chamber 10 is filled with hot water through the fluid inlet valve 60, while maintaining vacuum aspiration to remove air and any water vapor through valve 76. The hot water temperature may desirably be in the range of from about 50° to about 100° C. If high pressure operations are employed, temperatures higher than 100° C. may be used. The heated deionized water may be supplied to the chamber by a water heater which may be an integral part of the static dryer apparatus 12, or it may be supplied to the chamber from an external source of heated deionized water. It is important to avoid stagnant sites which might initiate bacterial growth or the accumulation of particulate or debris. Thus, the static dryer apparatus may be equipped with a deionized water by-pass 66.

It is an important feature of the present invention to avoid the development of a temperature differential between the heated water and the interior surfaces 36 of the chamber during the drying cycle. Thus, the chamber is equipped with means for maintaining the water and the interior surfaces of the chamber at a constant temperature throughout the drying cycle, particularly during filling and draining of the water. Heating elements 68 may desirably be provided on any or all of the exterior surfaces of the chamber to provide compensation for heat loss and to maintain the entire system at a constant temperature throughout the drying cycle.

During the drying procedure of this invention, filling with heated deionized water is continued until the water overflows through the vacuum aspirator valve 76. While maintaining the chamber completely filled with D.I. water, vacuum aspiration of the chamber is continued for a few minutes, for example 1.5 minutes, to completely degas the water. This step of degassing the water insures the removal of entrapped gas, particulate and other debris from the surface of the wafers and is extremely important to the efficient operation of this novel process. Since a small amount of water may be aspirated from the chamber through the vacuum aspirator valve 76, additional heated D.I. water is introduced as necessary to maintain the chamber completely filled throughout the degassing procedure.

At the completion of the degassing procedure, vacuum aspiration of the chamber is continued, and the drain valve 50 is opened allowing the water to drain from the chamber at a controlled rate, while clean dry inert gas is introduced through valve 82 over the draining water. According to the presently preferred embodiment, the chamber has a drain 50 which is connected to a vacuum aspirator 69 through a series of pneumatic valves 70, which may be both regulated and unregulated. During the rinsing operation prior to the drying process of this invention, the drain valves 70 allow the water to drain from the chamber completely. During the drying process, the regulated pneumatic valve 72 controls the drainage rate at between about one liter per minute up to about one gallon per second. The faster drainage rates may be made possible by providing multiple or larger drains 74, high vacuum aspiration, or by the use of a chamber with a collapsible wall 30 or 32.

The chamber is equipped with a vacuum valve 76 to provide aspiration and/or suction to the interior of the chamber 10 during both the filling and the draining procedures. The static dryer 12 of this invention is designed so that aspiration can be provided for both the vacuum valve 76 and the drain valve 50 of the chamber. During the filling procedure, the vacuum valve 76 is connected to the aspirator 69, allowing uniform filling of the chamber and exhausting any water vapor in the chamber generated by the water, particularly when heated water is being introduced. This prevents any undesirable build-up of pressure in the chamber. The vacuum in the chamber may range from about 100 mm to about 1000 mm Hg.

The vacuum and drainage valves 76 and 50, respectively, are connected in fluid flow communication with an aspirator tank 80 by means of fluid lines 78. Since water and condensable water vapor drain into the aspirator tank, the aspirator tank 80 is desirably provided with an overflow drain 92.

The chamber is also provided with a valve 82 to admit inert gas, such as clean air, argon or, preferably, nitrogen, into the evacuated chamber over the water during the draining, to insure that water droplets remain with the bulk of the draining water rather than allowing any water droplets to adhere to the surfaces of the wafers or the chamber. After the water has completely drained, the flow of inert gas is discontinued and vacuum aspiration of the chamber is continued for a few minutes to insure complete removal of water vapor from the chamber. Then, vacuum aspiration is discontinued. The flow of inert gas into the chamber is resumed, thereby re-pressurizing the chamber to normal atmospheric pressure or slightly above prior to releasing the fluid tight seal 54 and opening the chamber 10 to remove the dry wafers 20.

The entire operation of the static dryer 12 of this invention may suitably be programmed by a microprocessor based controller, capable of carrying out the necessary sequencing steps, including activating the various valves and equipment ancillary to the processing chamber.

Various sensors 90 are provided within the system responsive to its proper operation. Thus, sensors 90 are appropriately equipped to be responsive to the various levels of deionized water in the chamber 10 at different times in the rinsing and drying cycles, the proper operation of the chamber fluid tight seal 54, the proper operation of the drainage valve, vacuum valve, inert gas inlet valve, the aspirator tank and the inert gas supply. Should any of these sensors detect a malfunction, the operation of the system would immediately abort.

In operation of the static dryer 12 of this invention, the chamber is loaded with wafers and locked in a fluid tight seal. The cycle of rinsing the wafers is an optional procedure prior to the drying cycle. If rinsing of the wafers is preferred, the wafers may be rinsed using either cold or hot deionized water. To initiate the rinsing cycle, the vacuum valve 76 is opened in fluid flow communication with the aspirator 69 and the fluid inlet valve 60 is opened allowing the chamber to fill with deionized water. After the chamber has filled, the fluid inlet valve 60 is closed and the chamber drain valve 72 opens. This may be a slower regulated drain, a faster unregulated drain, or opening of the collapsible wall.

After completion of the rinse cycle, the chamber drain valve 72 is closed. The chamber heaters 68 maintain the temperature of the interior of the chamber at the same temperature as or slightly higher than the hot water which will be introduced for the drying cycle. Alternatively, the chamber may be heated by the introduction of heated inert gas of the same temperature as or slightly higher than the hot water which will be introduced. The fluid inlet valve 60 is then opened allowing the chamber 10 to fill with hot deionized water, while the vacuum valve 76 remains opened in fluid flow communication with the aspirator 69. The temperature of the water may generally be in the range of from 50° C. to about 100° C., preferably between about 60° and about 80° C., with the chamber heaters 68 maintained at the same temperature as or slightly higher than the hot water. Once the chamber has filled, vacuum aspiration of the filled chamber is continued for a few minutes, for example 1.5 minutes, to degas the water, removing entrapped gas, particulate and other debris to ensure that the surfaces of the wafers are completely wetted. Since a certain amount of water may be aspirated from the chamber through the vacuum valve 76, additional hot D.I. water may continue to be introduced to maintain the chamber completely filled. Once the degassing procedure has been completed, the fluid inlet valve 60 is closed, vacuum aspiration of the chamber is continued, inert gas is introduced over the water and the drain 50 is opened provided with vacuum assistance. The regulated drain valve 72 controls the drain rate as required. The presently preferred drain rate is about one gallon per minute.

Once the chamber has been drained, the introduction of inert gas is discontinued and the vacuum valve 76 is adjusted to maintain the vacuum at a level of between about 500 and about 760 mm of Hg. Preferably the vacuum in the chamber is maintained at about 600 mm of Hg. After a regulated amount of time, ranging from about 1 to about 5 minutes, the vacuum valve 76 is closed and heating of the chamber is discontinued. After the vacuum value has been closed, the inert gas inlet valve 82 is opened, allowing an inert gas, preferably nitrogen, to backfill into the chamber until the pressure within the chamber has returned to normal atmospheric pressure or slightly above. This completes the drying cycle and the fluid tight seal on the chamber is released and allowed to open. The wafers 20 and the interior surfaces 36 of the process chamber 10 are dry and void of water, water vapor and water vapor condensate at the completion of the process.

What is claimed is:

1. A process for drying substrates comprising:
    positioning the substrates in an enclosed chamber, said chamber being openable to permit insertion and removal of substrates and closeable to maintain the chamber in a fluid tight seal, said substrates being supported within the chamber primarily by their edges in spaced apart relationship generally parallel to each other, such that the planar surfaces of the substrates are inclined from the vertical at an angle of approximately 30°, and said chamber being equipped with fluid inlet valves, fluid drainage valves and vacuum aspiration valves for controlling the introduction of fluids into and drainage and vacuum aspiration of fluids out of said chamber, respectively;
    closing the chamber in a fluid tight seal;
    filling the chamber with rinsing solution through said fluid inlet valve while maintaining vacuum aspiration through the aspiration valve;
    degassing the rinsing solution by vacuum aspiration while maintaining the chamber filled with rinsing solution;
    draining the rinsing solution through the drainage valve, while continuing vacuum aspiration and introducing inert gas over the rinsing solution, said draining of the rinsing solution, vacuum aspiration and introduction of inert gas all controlled to allow the substrate to emerge dry as the rinsing solution drains away;
    discontinuing the flow of inert gas while continuing vacuum aspiration after draining the chamber; and repressurizing the chamber and releasing the fluid tight seal; such that the substrates are maintained in an essentially static condition throughout the drying process.

2. A process according to claim 1, wherein the rinsing solution is selected from halocarbons, alcohols, polyhydric alcohols nd deionized water.

3. A process according to claim 1 and further including rinsing the wafers in the chamber prior to the drying process, and, optionally, further including cleaning the wafers in the chamber prior to the rinsing process.

4. A process according to claim 1, wherein the rinsing solution is deionized water and is maintained at 50°-100° C. and filling the chamber with water is continued until the water overflows through the vacuum valve to assure complete filing of the chamber and the vacuum pressure within the filled chamber is maintained at about 100 mm Hg.

5. A process according to claim 1, wherein the substrates are positioned in the chamber, such that the planar surfaces of the wafers are inclined at an angle from the vertical of about 5°-15°, and the wafers are maintained at the inclined angle by inclining the chamber.

6. A process according to claim 1, wherein the chamber is heated to a temperature of 50° to slightly above 100° C. throughout the drying process.

7. A process according to claim 1, wherein degassing is continued for about 1.5 minutes to a chamber vacuum pressure of between about 300-400 mm Hg.

8. A process according to claim 1, wherein the chamber is formed of or interiorly lined with a fluoropolymer.

9. A process according to claim 1, wherein the fluid tight seal is maintained by pneumatic pressure.

10. A process according to claim 1, wherein the draining is assisted by vacuum aspiration and is controlled at a rate between about 1 liter per minute up to about 1 gallon per second.

11. A process according to claim 1, wherein the inert gas is nitrogen.

12. A process according to claim 1, wherein vacuum aspiration after the draining of the chamber is continued until the vacuum pressure in the chamber is between about 500 to about 750 mm of Hg.

13. A process according to claim 1, wherein the chamber is repressurized with an inert gas to normal atmospheric pressure or slightly above.

14. A process for drying substrates comprising: positioning the substrates in a chamber with a fluid tight seal;

surrounding and intimately contacting substrates in the chamber with a rinsing solution in the presence of vacuum aspiration;

continuing vacuum aspiration to degas the rinsing solution;

draining the rinsing solution from the chamber in a controlled manner while continuing vacuum aspiration and introducing inert gas over the rinsing solution to cause the surface of the substrate to emerge dry as the rinsing solution drains away;

continuing vacuum aspiration after the rinsing solution has drained to remove all vapor; and maintaining the substrates throughout the process in an essentially static condition with the planar surface of the substrates at an angle inclined from the vertical of approximately 30°.

15. A process according to claim 14, wherein the rinsing solutions selected from halocarbons, alcohols, polyhydric alcohols and deioized water.

16. A process according to claim 14 and further including rinsing the substrates in the chamber prior to the drying process, and, optionally, further including cleaning the wafers in the chamber prior to the rinsing process.

17. A process according to claim 14, wherein the rinsing solution is deionized water and is maintained at 50°-100° C. and the substrate is surrounded and intimately contacted with water to a vacuum pressure of about 100 mm Hg.

18. A process according to claim 14, wherein the planar surface of the substrate is maintained at an angle inclined from the vertical of about 5°-15°.

19. A process according to claim 14, including maintaining a temperature of 50° to slightly above 100° C. throughout the process.

20. A process according to claim 14, wherein the degassing is continued for about 1.5 minutes to a pressure of between about 300-400 mm Hg.

21. A process according to claim 14, wherein the draining is assisted by vacuum aspiration and is controlled at a rate between about 1 liter per minute up to about 1 gallon per second.

22. A process according to claim 14, wherein the inert gas is nitrogen.

23. A process according to claim 14, wherein vacuum aspiration after draining is continued until the vacuum pressure is between about 500-750 mm Hg.

* * * * *